US008357982B2

(12) United States Patent
Kajiyama

(10) Patent No.: US 8,357,982 B2
(45) Date of Patent: Jan. 22, 2013

(54) MAGNETIC MEMORY

(75) Inventor: Takeshi Kajiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 107 days.

(21) Appl. No.: 12/873,094

(22) Filed: Aug. 31, 2010

(65) Prior Publication Data

US 2011/0233697 A1    Sep. 29, 2011

(30) Foreign Application Priority Data

Mar. 24, 2010    (JP) ................................. 2010-068429

(51) Int. Cl.
*H01L 29/82* (2006.01)
(52) U.S. Cl. ................. 257/421; 257/E29.323; 365/158
(58) Field of Classification Search .................. 257/421, 257/E29.323; 365/158
See application file for complete search history.

(56) References Cited

U.S. PATENT DOCUMENTS

| 8,085,582 B2 | 12/2011 | Nakamura et al. |
| 2006/0187705 A1 | 8/2006 | Nakamura et al. |
| 2007/0241410 A1* | 10/2007 | Umehara et al. ............... 257/379 |
| 2008/0165454 A1* | 7/2008 | Kajiyama ................... 360/324.2 |
| 2009/0080105 A1 | 3/2009 | Takashita et al. |
| 2009/0244792 A1 | 10/2009 | Nakayama et al. |

FOREIGN PATENT DOCUMENTS

| JP | 2004-193595 | 7/2004 |
| JP | 2008-159613 | 7/2008 |
| JP | 2008-171882 | 7/2008 |
| JP | 2009-021352 | 1/2009 |
| JP | 2009-080878 A | 4/2009 |

OTHER PUBLICATIONS

N. Nozaki et al., "Influence of interlayer magnetostatic coupling on the ferromagnetic resonance properties of lithographically patterned ferromagnetic trilayers," Applied Physics Letters 92, 161903 (2008). Background Art Information, Jul. 2, 2010.
Japanese Office Action dated Jul. 10, 2012 for Japanese Application No. 2010-068429.

* cited by examiner

*Primary Examiner* — Calvin Lee
*Assistant Examiner* — Scott Stowe
(74) *Attorney, Agent, or Firm* — Knobbe, Martens, Olson & Bear, LLP

(57) ABSTRACT

According to one embodiment, a magnetic memory according to an embodiment includes a magnetoresistive effect element and a fourth magnetic layer which is provided on the side surface of the magnetoresistive effect element via an insulating film. The magnetoresistive effect element has a first magnetic layer of which the magnetization direction is variable, a second magnetic layer of which the magnetization direction fixed, a third magnetic layer of which the magnetization direction parallel to a film plane is variable, and an intermediate layer between the first magnetic layer and the second magnetic layer. The fourth magnetic layer collects a magnetic field generated from the end of the third magnetic layer.

20 Claims, 10 Drawing Sheets

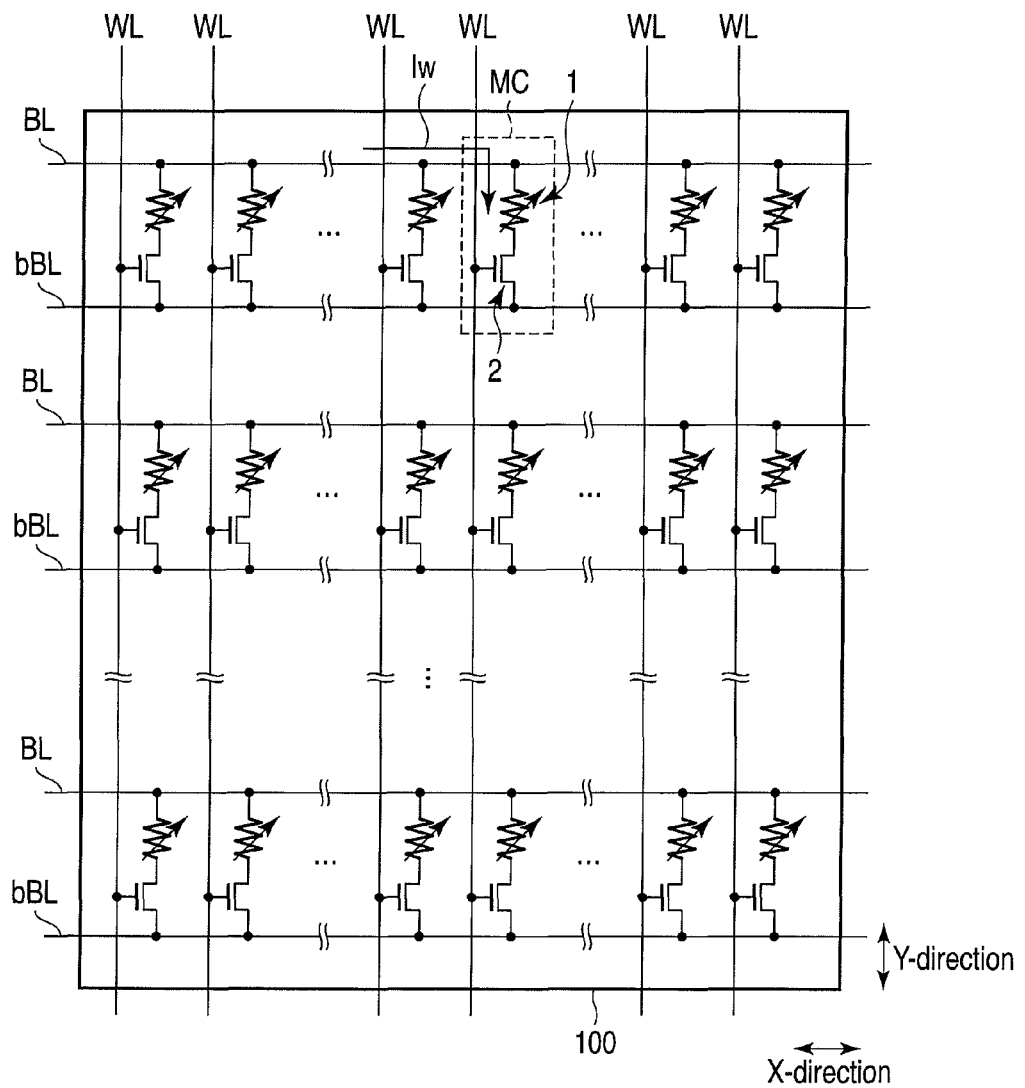
F I G. 1

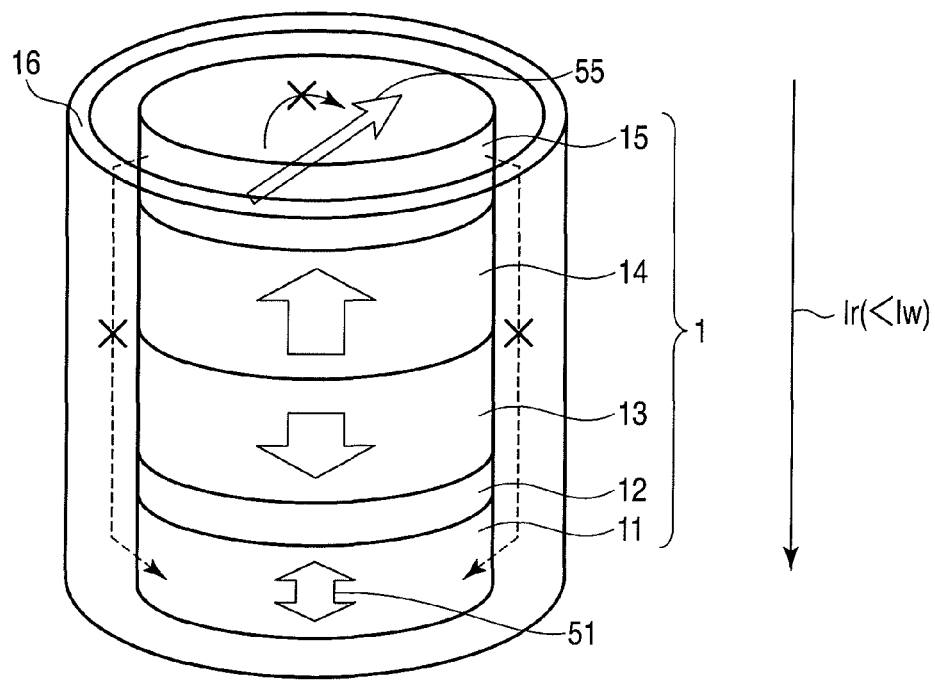
F I G. 6
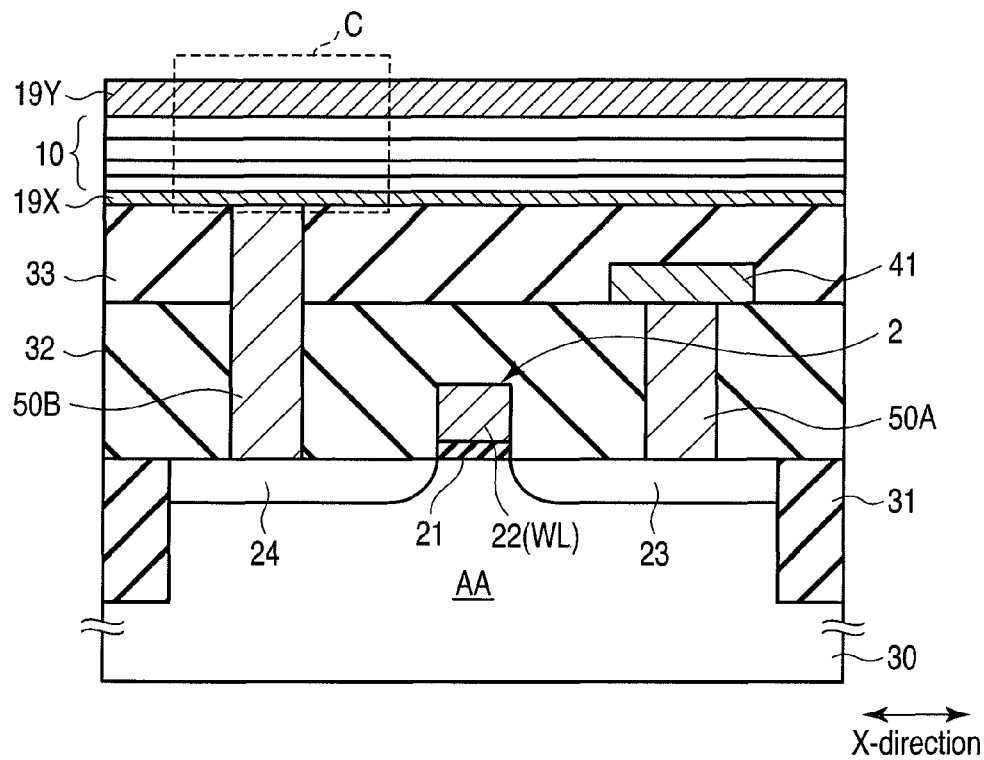
F I G. 7

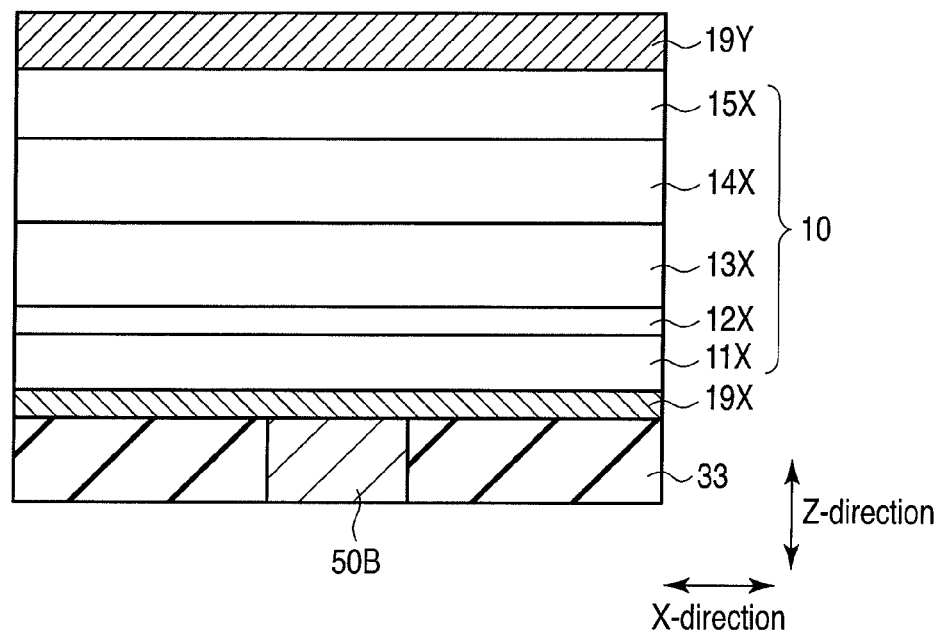
F I G. 8
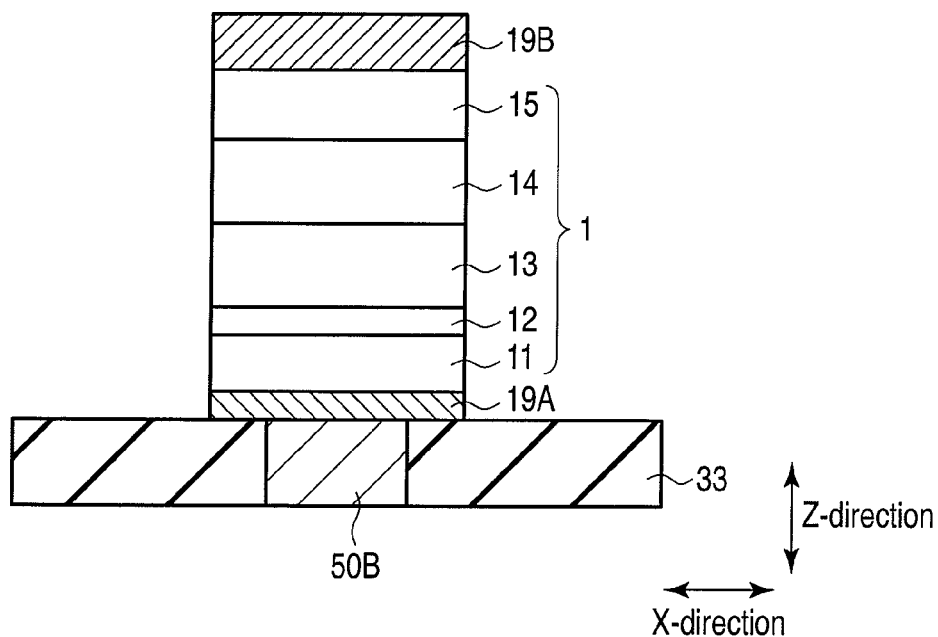
F I G. 9

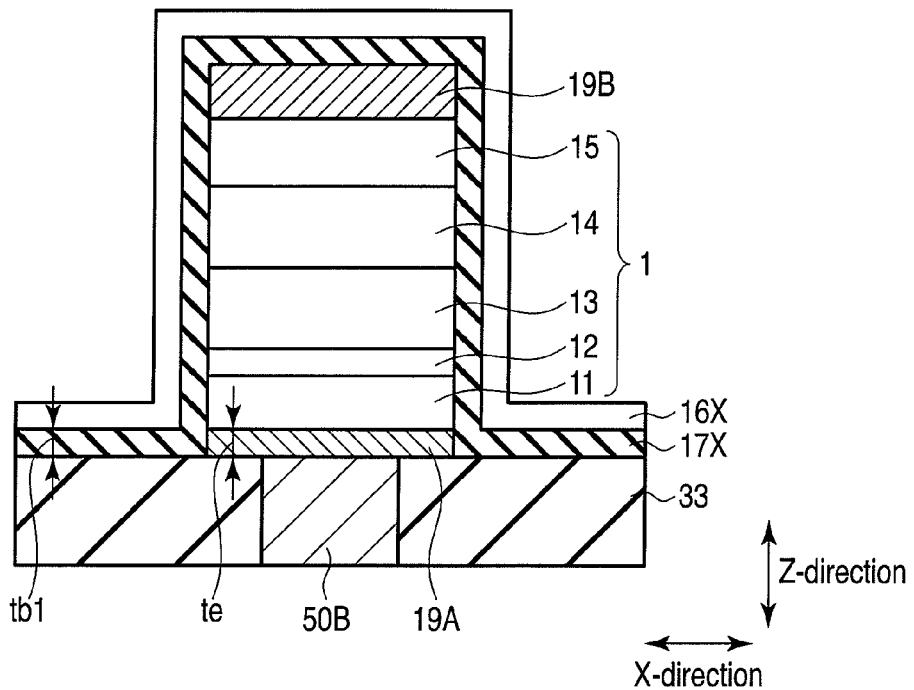
F I G. 10
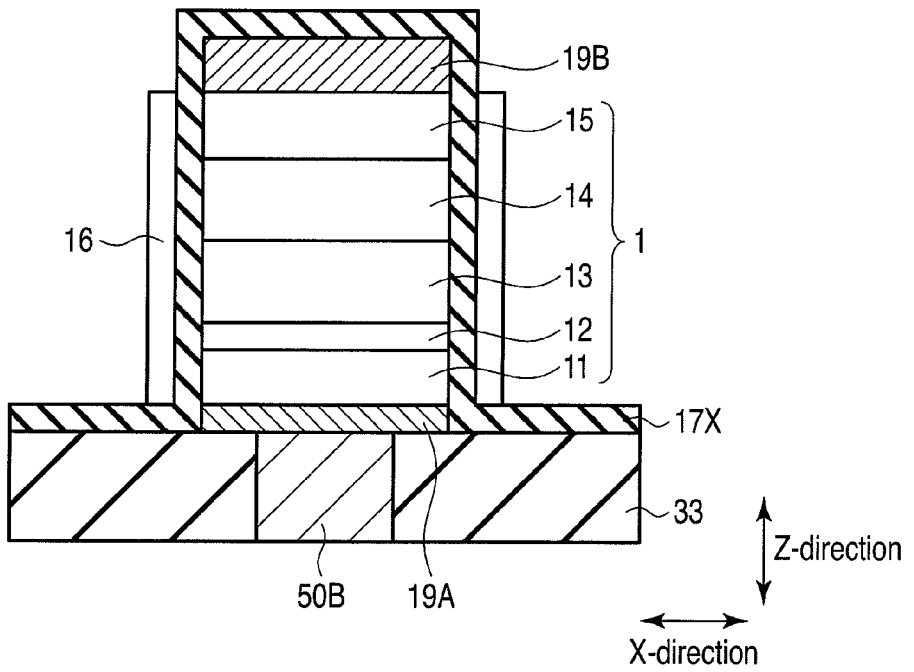
F I G. 11

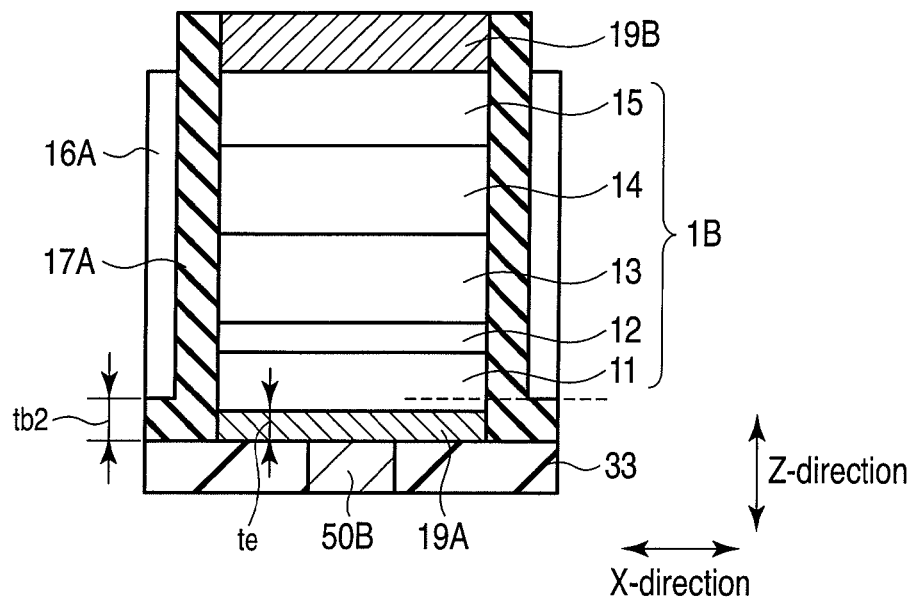
F I G. 14
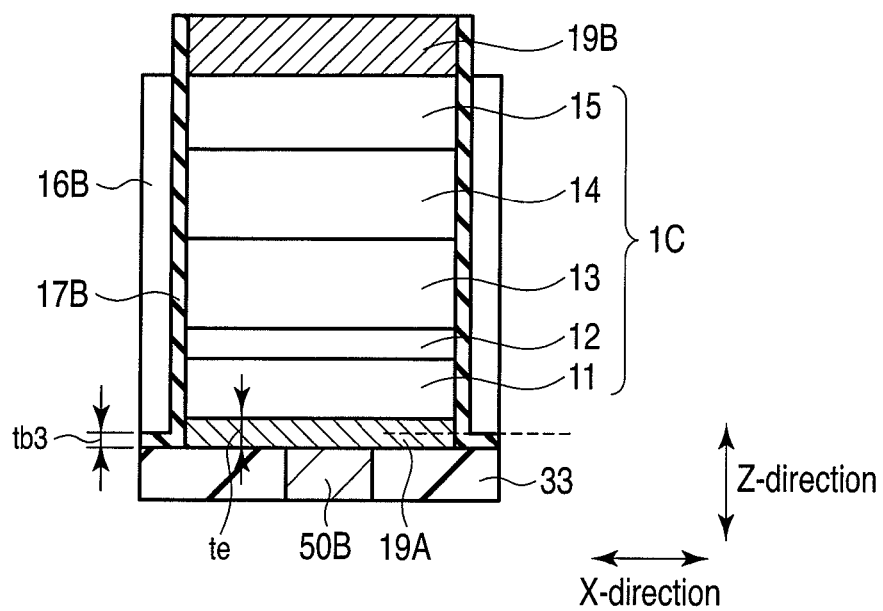
F I G. 15

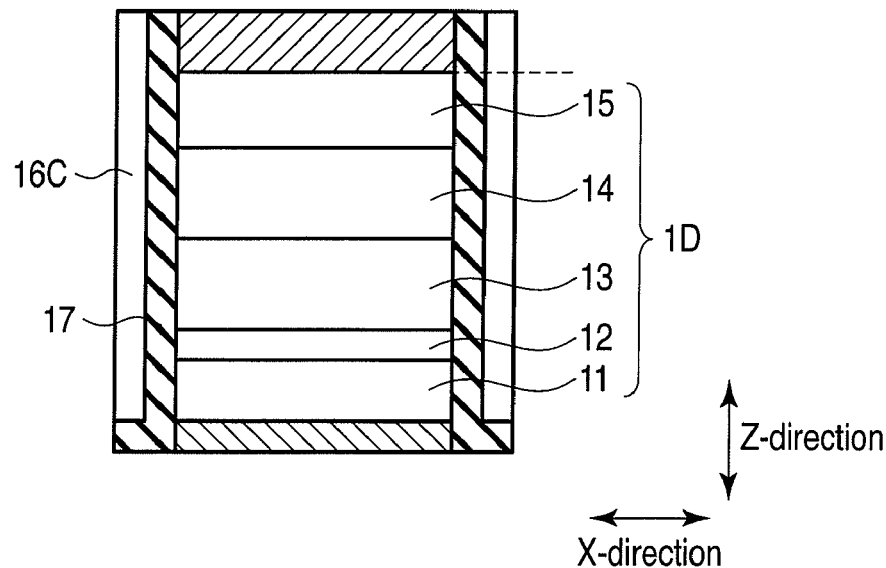
F I G. 16
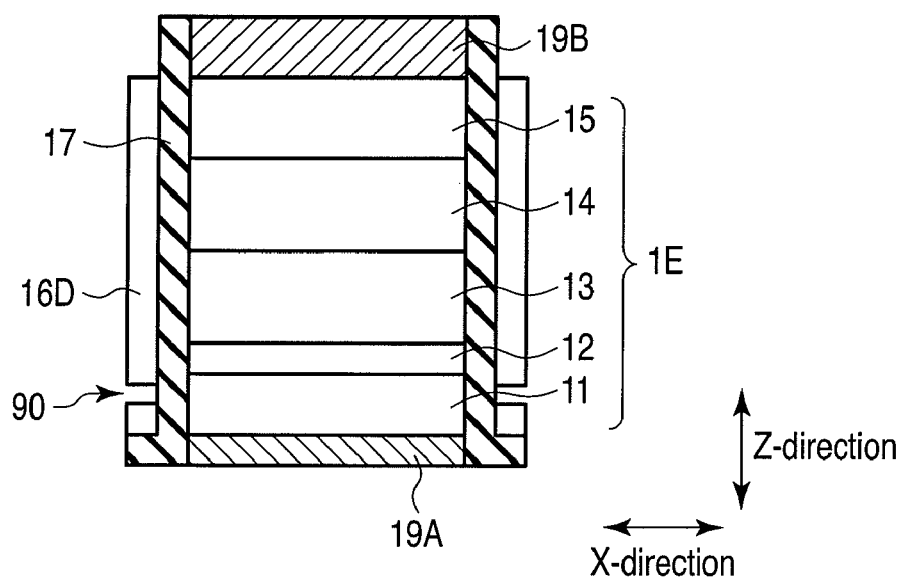
F I G. 17

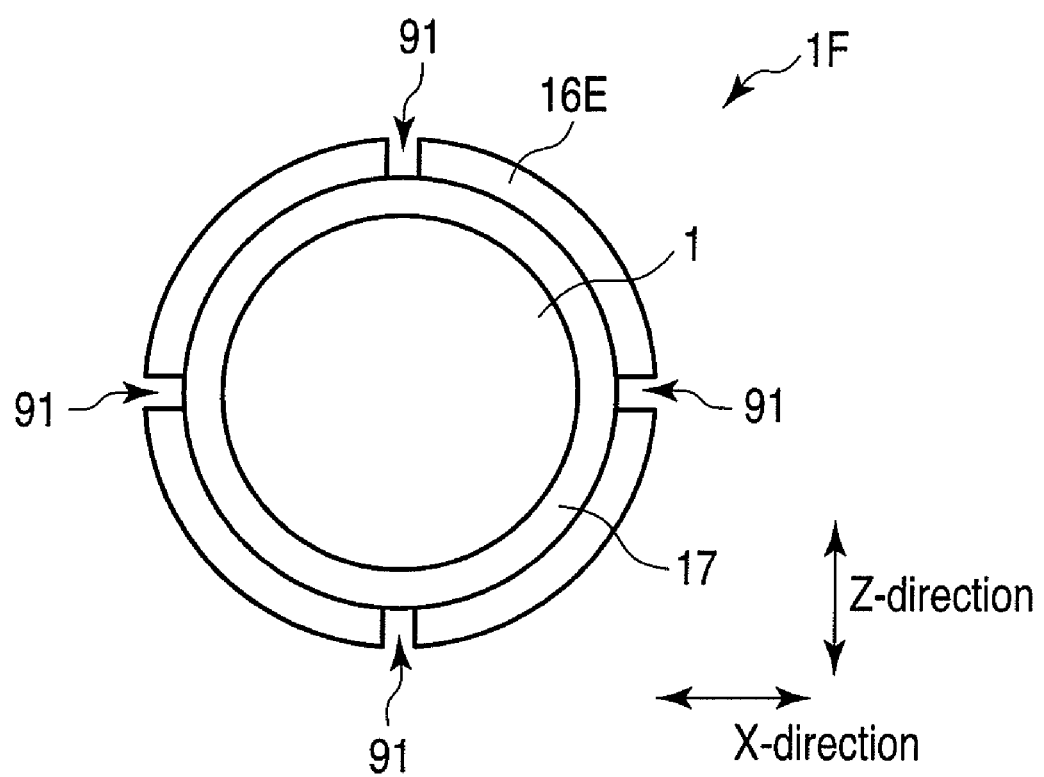
F I G. 18

MAGNETIC MEMORY

CROSS-REFERENCE TO RELATED APPLICATIONS

This application is based upon and claims the benefit of priority from Japanese Patent Application No. 2010-068429, filed Mar. 24, 2010; the entire contents of which are incorporated herein by reference.

FIELD

Embodiments described herein relate generally to a magnetic memory.

BACKGROUND

A magnetoresistive random access memory (MRAM) is known as one kind of magnetic memory. The magnetoresistive random access memory stores data by using a change in the resistance of a magnetoresistive effect element caused by a change in the relation of the magnetization directions of two ferromagnetic layers constituting the magnetoresistive effect element.

A memory cell of the magnetoresistive random access memory includes the magnetoresistive effect element and a field effect transistor (hereinafter referred to as a select transistor). A plurality of ferromagnetic layers and a nonmagnetic layer are stacked in the magnetoresistive effect element. The select transistor functions as a selecting switch. The magnetoresistive effect element includes the ferromagnetic layer which is invariable in magnetization direction (hereinafter referred to as a magnetization invariable layer or reference layer), the ferromagnetic layer which is variable in magnetization direction (hereinafter referred to as a magnetization free layer or storage layer), and the nonmagnetic layer intervening between these ferromagnetic layers. Data is written by changing the magnetization direction of the magnetization free layer.

In order to improve element characteristics, magnetoresistive effect elements using new techniques are under development. For example, Jpn. Pat. Appln. KOKAI Publication No. 2009-80878 has disclosed a magnetoresistive effect element (magnetic recording head) utilizing a high-frequency assist effect.

BRIEF DESCRIPTION OF THE DRAWINGS

FIG. 1 is an equivalent circuit diagram showing a memory cell array of a magnetoresistive random access memory;

FIG. 6 is a diagram illustrating the operation of the magnetoresistive effect element;

FIG. 7 is a diagram showing a method of manufacturing a magnetoresistive random access memory according to the embodiment;

FIG. 8 is a diagram showing the method of manufacturing the magnetoresistive random access memory according to the embodiment;

FIG. 9 is a diagram showing the method of manufacturing the magnetoresistive random access memory according to the embodiment;

FIG. 10 is a diagram showing the method of manufacturing the magnetoresistive random access memory according to the embodiment;

FIG. 11 is a diagram showing the method of manufacturing the magnetoresistive random access memory according to the embodiment;

FIG. 14 is a diagram showing a modification of the magnetoresistive random access memory according to the embodiment;

FIG. 15 is a diagram showing a modification of the magnetoresistive random access memory according to the embodiment;

FIG. 16 is a diagram showing a modification of the magnetoresistive random access memory according to the embodiment;

FIG. 17 is a diagram showing a modification of the magnetoresistive random access memory according to the embodiment; and FIG. 18 is a diagram showing a modification of the magnetoresistive random access memory according to the embodiment.

DETAILED DESCRIPTION

Figure 2:
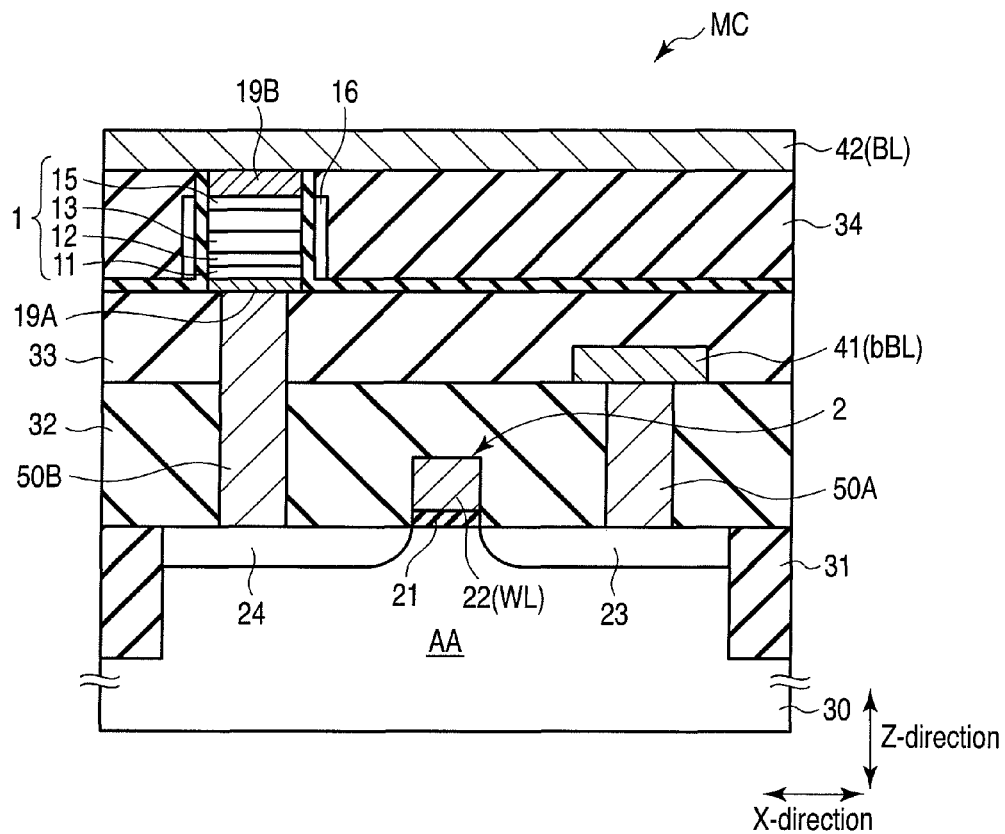
FIG. 2 is a sectional view showing an example of the structure of a memory cell.

In general, according to one embodiment, a magnetic memory according to an embodiment will be described hereinafter with reference to the drawings.

A magnetic memory according to an embodiment includes a magnetoresistive effect element and a fourth magnetic layer which is provided on the side surface of the magnetoresistive effect element via an insulating film. The magnetoresistive effect element has a first magnetic layer of which the magnetization direction is variable, a second magnetic layer of which the magnetization direction fixed, a third magnetic layer of which the magnetization direction parallel to a film plane is variable, and an intermediate layer between the first magnetic layer and the second magnetic layer. The fourth magnetic layer collects a magnetic field generated from the end of the third magnetic layer.

A magnetoresistive random access memory is described below as an example of the magnetic memory.

EMBODIMENT (1) Embodiment

The magnetoresistive random access memory according to the embodiment is described below referring to FIG. 1 to FIG. 12.

(a) Configuration

The configuration of the magnetoresistive random access memory (MRAM) according to the embodiment is described with FIG. 1 to FIG. 4.

FIG. 1 shows an equivalent circuit of a memory cell array 100 of the MRAM.

In the memory cell array 100, there are provided a plurality of bit lines BL, bBL extending in an X-direction, and a plurality of word lines WL extending in a Y-direction. One word lines WL and two bit lines BL, bBL are connected to one memory cell MC. The two bit lines BL, bBL make a pair of bit lines.

A plurality of memory cells MC are arrayed in the memory cell array 100. The memory cells MC arranged along the X-direction are connected to the common pair of bit lines BL, bBL. The memory cells MC arranged along the Y-direction are connected to the common word line WL.

Each of the memory cells MC includes one magnetoresistive effect element 1 and one selecting switch element 2. The selecting switch element 2 is, for example, a field effect transistor. The selecting switch element 2 will hereinafter be referred to as a select transistor 2.

One end of the magnetoresistive effect element 1 is connected to one bit line BL of the pair of bit lines. The other end of the magnetoresistive effect element 1 is connected to one end of the current path (source/drain) of the select transistor 2. The other end of the current path (source/drain) of the select transistor 2 is connected to the other bit line bBL of the pair of bit lines. The control terminal (gate) of the select transistor 2 is connected to the word line WL.

The magnetoresistive effect element 1 has two steady states. Depending on the steady state, the magnetization directions of two magnetic layers are directed parallel or antiparallel. The resistance of the element 1 changes in accordance with the two steady states. One of the two steady states of the magnetoresistive effect element 1 corresponds to data "0", and the other state corresponds to data "1", so that binary data is stored in the memory cells MC.

A write circuit (not shown) is connected to the bit lines BL, bBL. The write circuit has a constant current source. The constant current source supplies a write current Iw to the bit lines BL, bBL during writing of data.

In an MRAM of a spin-transfer magnetization inverting type, the write current Iw is passed across the selected bit lines BL, bBL during writing of data. If the select transistor 2 in a selected cell turns on, the write current Iw runs through the magnetoresistive effect element 1. Thus, the data is written in the selected memory cell.

A read circuit (not shown) is also connected to the bit lines BL, bBL. The read circuit has, for example, a constant current source and a sense amplifier. During reading of data, the read circuit supplies a read current to the bit lines BL, bBL. The read current is lower than the write current. If the select transistor 2 in a selected cell turns on, the read current runs through the magnetoresistive effect element 1. In accordance with the resistance of the magnetoresistive effect element 1, the potentials of the bit lines BL, bBL vary and the read current decreases. The read circuit determines the data by the variations of the potential and the current.

The structure of the memory cells constituting the magnetoresistive random access memory according to the embodiment is described with FIG. 2.

FIG. 2 is a sectional view showing an example of the structure of one memory cell MC. FIG. 2 shows the structure of the memory cell MC in section along the extending direction (X-direction) of the bit lines.

An isolation insulating film 31 is embedded in a semiconductor substrate 30. This isolation insulating film 31 defines an element formation region (semiconductor region) AA.

The select transistor 2 is provided in the element formation region AA. Two diffusion layers (first and second diffusion layers) 23, 24 are provided in the semiconductor substrate 30 that serves as the element formation region AA. The two diffusion layers 23, 24 serve as the source/drain of the transistor 2. A gate insulating film 21 is provided on the surface of the semiconductor substrate (channel region) 30 between the two diffusion layers (hereinafter referred to as source/drain diffusion layers) 23, 24. A gate electrode 22 is provided on the gate insulating film 21. The gate electrode 22 extends in the Y-direction, and is shared by the select transistors 2 arranged in the Y-direction. That is, the gate electrode 22 functions as the word line WL.

Contact plugs 50A, 50B are provided on the source/drain diffusion layers 23, 24. The contact plugs 50A, 50B are embedded in first interlayer insulating films 32, 33 covering the surface of the semiconductor substrate 30.

The magnetoresistive effect element 1 uses, for example, the interlayer insulating film 33 as a substrate, and is thus provided on the interlayer insulating film 33.

A lower electrode (first electrode) 19A of the magnetoresistive effect element 1 is provided on the contact plug 50B embedded in the interlayer insulating films 32, 33. The magnetoresistive effect element 1 is provided on the lower electrode 19A. An upper electrode (second electrode) 19B is provided on the magnetoresistive effect element 1.

The magnetoresistive effect element 1 is provided immediately above the contact plug 50B via the lower electrode 19A. However, a conductive layer extending in the X-direction may be provided between the lower electrode 19A and the contact plug 50B, and the magnetoresistive effect element 1 may be disposed at a position shifted in a direction parallel to the substrate surface from the position immediately above the contact plug 50B.

The magnetoresistive effect element 1 has a stack structure composed of a plurality of magnetic layers 11, 13, 15 and an intermediate layer 12 provided between two magnetic layers 11, 13.

The magnetoresistive effect element 1 is electrically connected to the source/drain diffusion layer 24 of the select transistor 2 via the lower electrode 19A and the contact plug 50B. Thus, one end of the magnetoresistive effect element 1 is connected to one end (source/drain) of the current path of the select transistor 2.

A magnetic layer 16 is provided on the side surface of the magnetoresistive effect element 1 via an insulating film.

The magnetoresistive effect element 1, the lower/upper electrodes 19A, 19B and the magnetic layer 16 are covered with an interlayer insulating film 34.

A first interconnect 42 (bit line BL) extending in the X-direction is provided on the magnetoresistive effect element 1 and on the interlayer insulating film 34. The interconnect 42 is connected to one end of the magnetoresistive effect element 1 via the upper electrode 19B of the magnetoresistive effect element 1. Although the interconnect 42 is in direct contact with the upper electrode 19B in FIG. 2, the upper electrode 19B and the interconnect 42 may be electrically connected to each other via a via contact and a conductive layer.

An interconnect 41 in the interlayer insulating film 33 is led in a depth direction of FIG. 2, and is connected to, for example, the second bit line bBL paired with the first bit line. The interconnect 41 may function as the second bit line bBL.

The interconnect 41 is electrically connected to the source/drain diffusion layer 23 of the select transistor 2 via the plug 50A. Thus, the other end (source/drain) of the current path of the select transistor 2 is connected to the bit line bBL.

Figure 3:
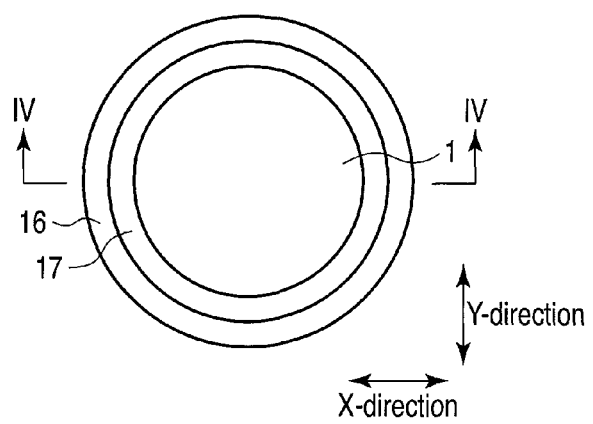
FIG. 3 is a plan view showing an example of the structure of a magnetoresistive effect element according to an embodiment.
Figure 4:
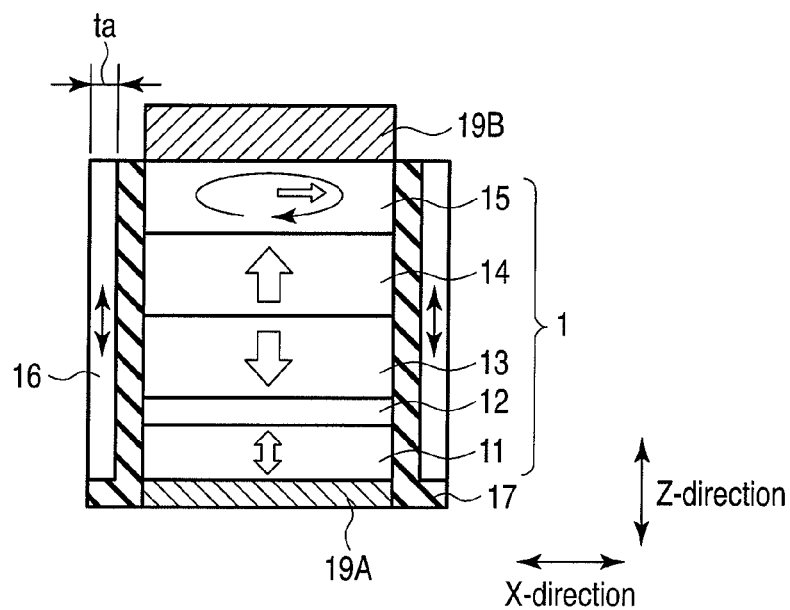
FIG. 4 is a sectional view showing an example of the structure of the magnetoresistive effect element according to the embodiment.

The structure of the magnetoresistive effect element 1 is described with FIG. 3 and FIG. 4. FIG. 3 shows the planar structure of the magnetoresistive effect element 1. FIG. 4 shows the sectional structure of the magnetoresistive effect element 1 along the line IV-IV of FIG. 3.

As shown in FIG. 3, the magnetoresistive effect element 1 has a circular, elliptic or approximately circular planar shape. Otherwise, the magnetoresistive effect element 1 may have a quadrangular or polygonal planar shape or a quadrangular planar shape with rounded corners.

As shown in FIG. 4, the magnetoresistive effect element 1 has a stack structure in which the intermediate layer 12 intervenes between the first magnetic layer 11 and the second magnetic layer 13. The magnetoresistive effect element 1 used in the MRAM is a magnetic tunnel junction (MTJ) element. The magnetoresistive effect element 1 will hereinafter be referred to as an MTJ element 1. The MTJ element 1 uses a magnetoresistive change resulting from a spin-polarized tunneling effect.

The first and second magnetic layers are ferromagnetic layers.

The magnetization (or spin) direction of the first magnetic layer 11 is variable and invertible. The magnetization of the second magnetic layer 13 is fixed and invariable in direction. The magnetization direction of the second magnetic layer 13 is fixedly set in one direction. The first magnetic layer 11 will hereinafter be referred to as a storage layer (also referred to as a magnetization free layer) 11. The second magnetic layer 13 will hereinafter be referred to as a reference layer (also referred to as a magnetization fixed layer) 13.

"That the magnetization direction of the reference layer 13 is invariable (fixed)" means that the magnetization direction of the reference layer 13 does not change when a magnetization inverting current used to invert the magnetization direction of the storage layer 11 is passed through the reference layer 13. Therefore, in the MTJ element 1, a magnetic layer with a high magnetization inverting current (inversion threshold) is used as the reference layer 13, and a magnetic layer with a magnetization inverting current lower than that of the reference layer 13 is used as the storage layer 11. This allows the MTJ element 1 to have the storage layer 11 variable in magnetization direction and the reference layer 13 invariable in magnetization direction (with fixed magnetization).

When the magnetization is inverted by spin-polarized electrons, a current used to invert the magnetization is proportional to the damping constant, anisotropic magnetic field and volume of the magnetic layer. Therefore, the damping constant, anisotropic magnetic field and volume can be properly adjusted so that there may be a difference of magnetization inverting current between the storage layer 11 and the reference layer 13.

The easy magnetization direction of the storage layer 11 and the reference layer 13 is substantially perpendicular to a film plane (or stack surface) (hereinafter referred to as perpendicular magnetization). In contrast, when the easy magnetization direction of the magnetic layers is substantially parallel to the film plane, this is referred to as in-plane magnetization.

The magnetic layers 11, 13 with the perpendicular magnetization have a magnetic anisotropy perpendicular to the film plane. In contrast with the in-plane magnetization type MTJ element, there is no need to control the shape (e.g., planar shape) of the element 1 to decide a magnetization direction when the MTJ element 1 is a perpendicular magnetization type, which is advantageous to element miniaturization.

The reference layer 13 and the storage layer 11 are made of a magnetic material having high coercive force. Specifically, the reference layer 13 and the storage layer 11 preferably have a high magnetic anisotropy energy density of $1 \times 10^6$ erg/cc or more. An alloy containing at least one substance selected from the group consisting of iron (Fe), cobalt (Co) and nickel (Ni) and at least one substance selected from the group consisting of chromium (Cr), platinum (Pt) and palladium (Pd) is used for the reference layer 13 and the storage layer 11 having the perpendicular magnetization. An ordered alloy or artificial lattice may be used for the reference layer 13 and the storage layer 11 having the perpendicular magnetization.

Each of the reference layer 13 and the storage layer 11 is not exclusively a single layer as shown, and may have a stack structure of ferromagnetic layers. Otherwise, each of the reference layer 13 and the storage layer 11 may have an antiferromagnetically coupled structure which is composed of three layers, namely, a ferromagnetic layer, a nonmagnetic layer and a ferromagnetic layer and which is magnetically coupled (exchange-coupled) so that the magnetization directions of the two ferromagnetic layers may be antiparallel. Alternatively, each of the reference layer 13 and the storage layer 11 may have a ferromagnetically coupled structure which is magnetically coupled (exchange-coupled) so that the magnetization directions of the two ferromagnetic layers may be parallel.

In the MTJ element 1 shown in FIG. 3 and FIG. 4, the storage layer 11 is provided on the lower electrode 19A.

The intermediate layer 12 is provided on the storage layer 11. The intermediate layer 12 is made of, for example, a nonmagnetic material such as an insulator, semiconductor or metal. When the insulator or semiconductor is used for the intermediate layer 12, the intermediate layer 12 is referred to as a tunnel barrier layer. The tunnel barrier layer is made of, for example, aluminum oxide or magnesium oxide.

The reference layer 13 is provided on the intermediate layer 12. For example, an antiferromagnetic layer 14 is provided on the reference layer 13. The antiferromagnetic layer 14 fixes the magnetization direction of the reference layer 13 by exchange bias coupling of the reference layer 13 and the antiferromagnetic layer 14. The antiferromagnetic layer 14 will hereinafter be referred to as an exchange bias layer 14.

In the MTJ element 1 according to the embodiment, the third magnetic layer 15 is provided on the exchange bias layer 14. The upper electrode 19B is provided on the third magnetic layer 15. The upper electrode 19B may be used as a hard mask for processing the MTJ element 1.

The easy magnetization direction of the third magnetic layer 15 is parallel to the film plane. The third magnetic layer 15 has a low magnetic anisotropy or has no magnetic anisotropy. The third magnetic layer 15 is made of a magnetic material such as NiFe or CoFeB.

When a write current is passed through the MTJ element 1 shown in FIG. 4 during writing of data, the magnetization (spin) of the magnetic layer 15 having the in-plane magnetization rotates at high speed in a direction parallel to the film plane in accordance with a right-handed screw rule. The magnetic layer 15 will hereinafter be referred to as a rotation layer (also referred to as a magnetization rotation layer) 15. Due to the rotation of the magnetization of the rotation layer 15, a high-frequency leak magnetic field is generated from the end (top surface/side surface) of the rotation layer 15. The magnetic field generated from the rotation layer 15 is applied to the storage layer 11.

The magnetization inverting current (inversion threshold) of the storage layer 11 is reduced by the synchronization (resonance) of the frequency of the leak magnetic field with the precession movement of the storage layer 11 during writing.

According to the embodiment, the effect of reducing the inversion threshold of the storage layer 11 by the resonance of the precession movement of the storage layer 11 and the magnetic field generated by the rotation layer 15 is referred to as a high-frequency magnetic field assist effect.

The rotation layer 15 is made of NiFe or CoFeB. However, the rotation layer 15 is not exclusively made of such a material. As long as the rotation layer 15 includes NiFe or CoFeB as the main component, the rotation layer 15 may include other elements or any magnetic material different from NiFe or CoFeB.

Furthermore, according to the embodiment, the rotation layer 15 for the high-frequency magnetic field assist effect is provided in the MTJ element 1, and additionally, the fourth magnetic layer 16 is provided on the side surface of the MTJ element 1.

In the MTJ element 1 shown in FIG. 3 and FIG. 4, the magnetic layer 16 cylindrically covers the side surface of the MTJ element 1 via an insulating film 17. The magnetic layer 16 will hereinafter be referred to as a sidewall magnetic layer 16. Moreover, the insulating film 17 will hereinafter be referred to as a sidewall insulating film 17.

The sidewall magnetic layer 16 is an in-plane magnetization soft-magnetic layer. The plane of the sidewall magnetic layer 16 faces the side surface of the MTJ element 1. Therefore, the magnetization direction of the sidewall magnetic layer 16 is perpendicular to the substrate surface. For example, the magnetization direction of the sidewall magnetic layer 16 is variable. Moreover, the magnetization direction of the sidewall magnetic layer 16 changes in response to the magnetic field generated from the rotation layer 15. That is, since the magnetization direction of the sidewall magnetic layer 16 is variable, the magnetization of the sidewall magnetic layer 16 is directed upward (toward the upper electrode) or downward (toward the lower electrode) depending on the direction of the magnetic field generated from the rotation layer 15, as shown in FIG. 4.

In the example shown in FIG. 4, the height of the upper end of the sidewall magnetic layer 16 in the stacking direction (Z-direction) of the MTJ element 1 corresponds to, for example, the position of the bottom surface of the upper electrode 19B and the position of the top surface of the rotation layer 15. The height of the lower end of the sidewall magnetic layer 16 in the Z-direction corresponds to, for example, the position of the top surface of the lower electrode 19A and the position of the bottom surface of the storage layer 11.

However, the height of the upper end of the sidewall magnetic layer 16 does not have to correspond to the position of the top surface of the rotation layer 15, and the height of the lower end of the sidewall magnetic layer 16 does not have to correspond to the position of the bottom surface of the storage layer 11. The upper end of the sidewall magnetic layer 16 may be located between the top and bottom surfaces of the rotation layer 15. The lower end of the sidewall magnetic layer 16 may be located between the top and bottom surfaces of the storage layer 11. The upper end of the sidewall magnetic layer 16 may be located higher than the bottom surface of the upper electrode 19B, and the lower end of the sidewall magnetic layer 16 may be located lower than the top surface of the lower electrode 19A.

The thickness to of the sidewall magnetic layer 16 is, for example, less than or equal to the thickness of the MTJ element 1. When the thickness of the MTJ element 1 is about 20 nm to 30 nm, the thickness of the sidewall magnetic layer 16 is about 10 nm to 20 nm. However, the thickness of the sidewall magnetic layer 16 may be properly changed depending on the dimensions, shape and characteristics of the MTJ element 1. In addition, the sidewall magnetic layer 16 does not exclusively have a single-layer structure and may have a multilayer structure composed of a plurality of magnetic layers.

The sidewall insulating film 17 between the MTJ element 1 and the sidewall magnetic layer 16 has only to be sized at such a thickness that the magnetization (spin) of the sidewall magnetic layer 16 does not interfere with the magnetizations of the magnetic layers 11, 13, 14, 15 of the MTJ element 1.

In addition, the thickness (height) of the MTJ element 1 is a dimension in a direction perpendicular to the substrate surface. On the side surface of the MTJ element 1, the thickness of the sidewall magnetic layer 16 and the sidewall insulating film 17 is a dimension in a direction parallel to the substrate surface.

The sidewall magnetic layer 16 is used as a yoke. The material for the sidewall magnetic layer 16 serving as the yoke is NiFe or CoFeB. However, any one of substances selected from the group consisting of Permalloy, CoFe, CoFiNi, IrMn and PtMn may be used as the material for the sidewall magnetic layer 16. As long as the sidewall magnetic layer 16 includes such a material as the main component, the sidewall magnetic layer 16 may include other elements as constituent materials.

The sidewall insulating film 17 is made of, for example, silicon nitride (SiN) or aluminum oxide. However, silicon oxide or some other insulating metal compounds may be used as the materials for the sidewall insulating film 17.

The sidewall magnetic layer 16 collects the leak magnetic field (magnetic flux) generated from the rotation layer 15. Thus, the dispersion of the high-frequency leak magnetic field generated from the rotation layer in the interlayer insulating film is reduced, and the magnetic field generated from the rotation layer 15 concentrates in the sidewall magnetic layer 16. The flux of the magnetic field resonates and is thus amplified in a closed path within the sidewall magnetic layer 16. The magnetic field concentrating in the sidewall magnetic layer 16 is provided to the storage layer 11. As a result, the magnetic field generated from the rotation layer 15 is efficiently applied to the storage layer 11, and the high-frequency magnetic field assist effect on the MTJ element 1 increases. Thus, the inversion threshold of the magnetization of the storage layer 11 can be reduced by the increase of the high-frequency magnetic field assist effect resulting from the collection of the magnetic field.

The sidewall magnetic layer 16 preferably covers the entire side surfaces of the storage layer 11 and the rotation layer 15 to collect the magnetic field generated from the rotation layer 15 and to collect the magnetic field effectively to the magnetization of the storage layer 11.

Consequently, in the magnetic memory (e.g., MRAM) according to the embodiment, the write current running through the magnetoresistive effect element can be reduced.

In the structure shown in FIG. 4, the storage layer 11 is located on the side of the lower electrode 19A (bottom side), and the rotation layer 15 is located on the side of the upper electrode 19B (top side). It should be understood that similar advantages to the advantages according to the structure shown in FIG. 4 can be brought about in the MRAM according to the embodiment even if the layers are stacked in inverse order from the order shown in FIG. 4.

(b) Operation

Figure 5:
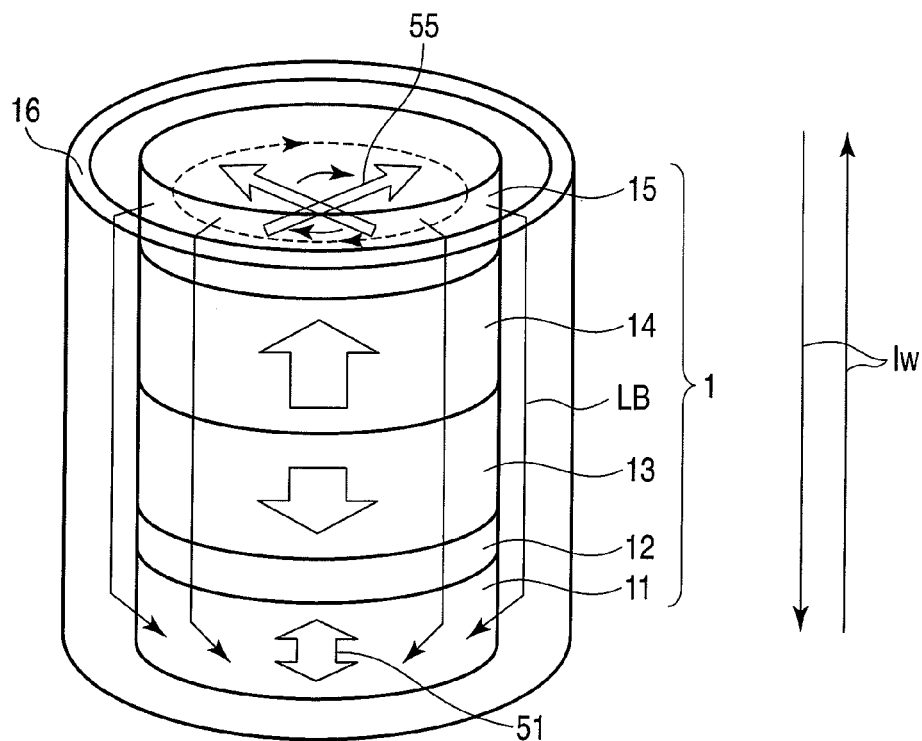
FIG. 5 is a diagram illustrating the operation of the magnetoresistive effect element.

The operation principle of the MTJ element 1 according to the embodiment is described with FIG. 5 and FIG. 6.

First, the operation of writing data into the MTJ element 1 in accordance with a spin-transfer writing scheme is described with FIG. 5.

In accordance with the spin-transfer writing scheme, the write current Iw runs through the MTJ element 1 during writing of data. The write current Iw is greater than or equal to the magnetization inverting current (inversion threshold) of the storage layer 11. Then, the write current Iw bi-directionally runs through the MTJ element 1 in accordance with the data to be written. Depending on the write current Iw, the relative magnetization directions of the reference layer 13 and the storage layer 11 change to a parallel or antiparallel state.

The parallel state (low-resistance state) is described wherein the magnetization directions of the reference layer 13 and the storage layer 11 are parallel. The write current Iw runs from the storage layer 11 to the reference layer 13. In this case, electrons transferring from the reference layer 13 to the storage layer 11 are supplied.

The majority of electrons which have passed through the reference layer 13 have a spin parallel to (in the same direction as) the magnetization direction of the reference layer 13. The spin angular momentum of the majority of electrons moves to the storage layer 11, so that spin torque is applied to the storage layer 11. The precession movement of a magnetization 51 of the storage layer 11 is amplified by the applied spin torque. And the write current Iw is passed for a sufficient period, the magnetization direction of the storage layer 11 is inverted.

Thus, the magnetization direction of the storage layer 11 becomes parallel to the magnetization direction of the reference layer 13. In this parallel arrangement, the resistance of the MTJ element 1 is the lowest. When the magnetizations of the reference layer 13 and the storage layer 11 are parallel (in the same direction), this state is defined as, for example, the data "0".

The antiparallel state (high-resistance state) is described wherein the magnetization directions of the reference layer 13 and the storage layer 11 are antiparallel. The write current Iw runs from the reference layer 13 to the storage layer 11. In this case, electrons transferring from the storage layer 11 to the reference layer 13 are supplied.

The majority of electrons which have been reflected by the reference layer 13 have a spin antiparallel (opposite) to the magnetization direction of the reference layer 13. The spin angular momentum of the majority of electrons moves to the storage layer 11, so that spin torque is applied to the storage layer 11. The precession movement of the magnetization 51 of the storage layer 11 is amplified by the spin torque, and the magnetization direction of the storage layer 11 is inverted.

Thus, the magnetization direction of the storage layer 11 becomes antiparallel to the magnetization direction of the reference layer 13. In this antiparallel arrangement, the resistance of the MTJ element 1 is the highest. When the magnetizations of the reference layer 13 and the storage layer 11 are antiparallel (opposite), this state is defined as, for example, the data "1".

Now, the high-frequency magnetic field assist effect according to the embodiment is described with FIG. 5.

When the write current Iw is supplied to the MTJ element 1, a magnetization 55 of the rotation layer 15 parallel to the film plane rotates at high speed with a frequency fw in accordance with the right-handed screw rule. At the same time, a leak magnetic field LB is emitted from the ends of the top and side surfaces of the rotation layer 15. This leak magnetic field LB is a high-frequency magnetic field corresponding to the rotation period of the magnetization 55. The leak magnetic field LB rotates with, for example, the frequency fw. The frequency fw is, for example, about 1 MHz to 60 MHz. The rotation direction of the magnetization 55 of the rotation layer 15 changes in accordance with the running direction of the write current Iw.

The magnetic field LB generated by the rotation layer 15 is applied to the storage layer 11. For example, the direction of the magnetic field applied to the storage layer 11 is substantially parallel to the plane of the storage layer 11.

The frequency fw of the magnetic field LB synchronizes with the precession movement of the magnetization 51 of the storage layer 11, so that the magnetization 51 of the storage layer 11 is easily inverted. That is, the inversion threshold of the magnetization 51 of the storage layer 11 decreases.

Furthermore, according to the embodiment, the sidewall magnetic layer 16 serving as the yoke is provided on the side surface of the MTJ element 1 having the rotation layer 15. The outward dispersion of the magnetic field LB generated from the end of the rotation layer 15 is inhibited by the sidewall magnetic layer 16, and the magnetic field LB concentrates inside the sidewall magnetic layer 16. The magnetization direction of the sidewall magnetic layer 16 changes in accordance with the direction of the leak magnetic field. Therefore, the magnetic field LB generated from the rotation layer 15 is more efficiently applied to the magnetization 51 of the storage layer 11.

Thus, in the MRAM according to the embodiment, the high-frequency magnetic field assist effect on the MTJ element increases.

Consequently, in the MRAM according to the embodiment, the write current Iw running through the MTJ element 1 can be reduced during writing of data.

It is preferable that the magnetic anisotropy energy Ku of the storage layer 11, the saturation magnetization $M_s$ of the storage layer 11, and the frequency fw of the leak magnetic field LB generated from the rotation layer 15 be properly set so that the frequency fw of the magnetic field LB applied to the storage layer 11 synchronizes with the precession movement of the magnetization 51 of the storage layer 11. This is because the approximation of a condition derived from the above-mentioned parameters to a condition for the resonance of the frequency fw and an effective magnetic moment $M_{eff}$ of the storage layer 11 is preferable for an enhanced high-frequency magnetic field assist effect.

Here, the frequency fw is represented by $$2\pi fw = \gamma(-4\pi M_{eff}) = \omega \quad \text{(Equation 1)}$$

wherein "$\omega$" is an angular frequency, and "$\gamma$" is a gyromagnetic ratio.

The effective magnetic moment $M_{eff}$ is represented by $$M_{eff} = 4\pi M_s - 2Ku/M_s \quad \text{(Equation 2)}.$$

For example, similarly to the inversion of the magnetization 51 of the storage layer 11, the rotation of the magnetization 55 of the rotation layer 15 may depend on the intensity of the write current Iw and originate in the precession movement of the magnetization 55.

Moreover, for faster and more uniform (smoother) rotation of the magnetization of the rotation layer 15, the magnetic anisotropy energy of the rotation layer 15 is preferably lower.

For example, when the rotation layer 15 has an in-plane magnetization, the rotation layer 15 is formed into a circular or square planer shape so that the shape magnetic anisotropy of the rotation layer 15 is reduced or eliminated. Thus, the rotation layer 15 can have lower or zero magnetic anisotropy energy, as compared with the rotation layer having an elliptic or rectangular planer shape. This allows faster rotation of the magnetization of the rotation layer 15 and constant frequency of the resulting magnetic field. In this case, the planer shape of the MTJ element 1 is also circular or square. Therefore, magnetic layers having the perpendicular magnetization are preferably used for the reference layer 13 and the storage layer 11 such that the magnetization directions of these layers may not be shape-dependent.

Moreover, in addition to the materials mentioned above, the material for the rotation layer 15 is also properly set depending on the materials for the reference layer 13 and the storage layer 11.

The operation of reading data from the MTJ element 1 is described with FIG. 6.

To read data retained in the storage layer 11, a current Ir runs through the MTJ element 1 as in the writing operation. However, the read current Ir used for reading data is lower than the inversion threshold of the storage layer 11. During the data reading, the read current Ir may run from the storage layer 11 to the reference layer 13 or vice versa.

Since the read current Ir is low, the magnetization 55 of the rotation layer 15 hardly rotates. Thus, no high-frequency magnetic field LB is generated from the rotation layer 15.

Therefore, even if the sidewall magnetic layer 16 that inhibits the dispersion of the magnetic field is provided on the side surface of the MTJ element, the inversion probability of the magnetization of the storage layer 11 does not increase during the operation of reading data from the MTJ element to which the high-frequency magnetic field assist effect is applied. That is, in the MRAM according to the embodiment, the probability of read disturb occurrence does not increase.

As described above, in the MRAM according to the embodiment, the magnetic layer 16 is provided on the side surface of the MTJ element 1 that has the rotation layer 15 for the high-frequency magnetic field assist effect.

In the case of the MTJ element 1 used in the MRAM according to the embodiment, the dispersion of the magnetic field LB generated from the rotation layer 15 is inhibited by the magnetic layer 16 provided on the side surface of the MTJ element 1, so that the high-frequency assist effect of the magnetic field LB can be increased. Thus, the inversion threshold of the magnetization of the storage layer 11 decreases.

Consequently, in the MRAM according to the embodiment, the write current for the magnetoresistive effect element can be reduced.

(c) Manufacturing Method

A method of manufacturing a magnetoresistive random access memory (MRAM) according to the embodiment is described below with FIG. 2 to FIG. 12. Here, for ease of explanation, one of memory cells in the memory cell array of the MRAM is extracted and described.

FIG. 7 shows a sectional process view along the X-direction of a memory cell MC of the MRAM.

As shown in FIG. 7, for example, an isolation insulating film 31 having a shallow trench isolation (STI) structure is embedded into a semiconductor substrate 30, thereby forming an isolation region. An element formation region AA is defined by the formation of the isolation region.

Then, a select transistor 2 of the memory cell MC is formed on the element formation region AA of the semiconductor substrate 30. The process of forming the select transistor is as follows:

A gate insulating film 21 is formed on the surface of the element formation region AA. The gate insulating film 21 is, for example, a silicon oxide film formed by a thermal oxidation method.

Furthermore, a conductive layer (e.g., a polysilicon layer) is formed on the gate insulating film 21 by, for example, a chemical vapor deposition (CVD) method. The conductive layer is processed into a predetermined pattern by a photolithographic technique and a reactive ion etching (RIE) method. Thus, a gate electrode 22 is formed on the gate insulating film 21. In order to use the gate electrode 22 as a word line WL, the gate electrode 22 is processed to extend in a direction (Y-direction in FIG. 1) that intersects with the X-direction. The gate electrode 22 is shared by a plurality of select transistors arranged in the Y-direction.

Then, source/drain diffusion layers 23, 24 are formed in the semiconductor substrate 30. In order to form the diffusion layers 23, 24, the gate electrode 22 is used as a mask, and an impurity such as arsenic (As) or phosphorus (P) is implanted into the semiconductor substrate 30 by an ion implantation method.

As a result of the process described above, the select transistor 2 is formed on the semiconductor substrate 30. Although the process of manufacturing one select transistor is only shown in FIG. 7, a plurality of select transistors 2 are simultaneously formed in the memory cell array.

Furthermore, as shown in FIG. 7, an interlayer insulating film 32 is formed by, for example, the CVD method on the semiconductor substrate 30 to cover the select transistor 2. The top surface of the interlayer insulating film 32 is planarized by a chemical mechanical polishing (CMP) method.

Then, a contact hole is formed in the interlayer insulating film 32 so that the top surface of one source/drain diffusion layer 23 may be exposed. The formed contact hole is filled with, for example, tungsten (W) or molybdenum (Mo), thereby forming a contact plug 50A. An interconnect 41 connected to one end of the select transistor is formed on the contact plug 50A by a sputtering method and the photolithographic technique. In a subsequent step, the interconnect 41 is connected to a bit line bBL which is connected to one end of the memory cell.

An interlayer insulating film 33 is deposited by, for example, the CVD method on the interlayer insulating film 32 to cover the interconnect 41.

A contact hole is formed in the interlayer insulating films 32, 33 so that the top surface of the other source/drain diffusion layer 24 may be exposed. A contact plug 50B is embedded into this contact hole. The top surface of the contact plug 50B is exposed.

On the exposed top surface of the contact plug 50B and on the interlayer insulating film 33, a first electrode layer 19X, a stack 10 as a component of the MTJ element, and a second electrode layer 19Y are deposited in order by, for example, the sputtering method and the CVD method. The configuration of layers included in the stack 10 and the process of manufacturing these layers are described below with FIG. 8 to FIG. 12. FIG. 8 to FIG. 12 are sectional process views of an enlarged zone C enclosed by a dotted line in FIG. 7.

As shown in FIG. 8, the first conductive layer 19X is deposited on the interlayer insulating film 33 and the contact plug 50B. The first conductive layer 19X serves as a lower electrode of a magnetoresistive effect element (MTJ element). For example, tantalum (Ta), titanium (Ti), titanium nitride (TiN), tantalum nitride (TaN) or a stack film of titanium and titanium nitride (Ti/TiN) is used for the first electrode layer 19X.

The stack 10 serves as the magnetoresistive effect element (MTJ element). The stack 10 includes at least three magnetic layers 11X, 13X, 15X, and an intermediate layer 12X (e.g., a nonmagnetic layer) intervening between two magnetic layers 11X, 13X.

In FIG. 8, a first magnetic layer 11X, an intermediate layer 12X and a second magnetic layer 13X are deposited on the electrode layer 19X in order.

The magnetic layers 11X, 13X are, for example, magnetic layers having a perpendicular magnetization. The magnetic layer 11X serves as a storage layer of the MTJ element, and the magnetic layer 13X serves as a reference layer of the MTJ element. The material for the magnetic layers 11X, 13X is, for example, an alloy including at least one of Fe, Co and Ni and at least one of Cr, Pt and Pd. The material for the intermediate layer 12X is an oxide such as MgO.

For example, an antiferromagnetic layer (exchange bias layer) 14X is deposited on the second magnetic layer 13X.

Then, a third magnetic layer (rotation layer) 15X is deposited on the antiferromagnetic layer 14X. The third magnetic layer 15X is an in-plane magnetization film having no (low) magnetic anisotropy. For example, NiFe or CoFeB is used as the material for the third magnetic layer 15X.

The second conductive layer 19Y serves as an upper electrode of the MTJ element. For example, the conductive layer 19Y is also used as a hard mask when the stack 10 is processed. The material for the conductive layer 19Y is the same as the material for the conductive layer 19X. The material for the conductive layer 19Y may be different from the material for the conductive layer 19X. For example, tungsten (W) or molybdenum (Mo) may be used for the upper conductive layer 19Y. The conductive layers 19X, 19Y do not exclusively have a single-layer structure of a conductor and may have a stack structure of a plurality of conductors.

Then, as shown in FIG. 9, the stack and the conductive layers are processed into a predetermined shape by the photolithographic technique and the RIE method starting from the conductive layer 19Y in order. As a result, a lower electrode 19A, a magnetoresistive effect element (MTJ element) 1 and an upper electrode 19B are formed on the contact plug 50B. A plurality of MTJ elements 1 are arrayed in the memory cell array so that the memory cells are formed by the MTJ elements and by the select transistors formed on the semiconductor substrate. In addition, an insulator such as silicon oxide or silicon nitride may be deposited on the conductive layer 19Y and used as a hard mask during the processing. The hard mask made of the insulator is removed after the processing.

The planar shape of the formed MTJ element 1 is, for example, circular or elliptic. When the planar shape of the MTJ element 1 is circular, the shape magnetic anisotropy (shape anisotropy energy) of the formed rotation layer 15 is substantially eliminated (reduced).

For example, the storage layer 11 of the MTJ element 1 is formed on the lower electrode 19A. The intermediate layer (nonmagnetic layer) 12 of the MTJ element 1 is formed on the storage layer 11. Then, the reference layer 13 is formed on the intermediate layer 12.

The formed MTJ element 1 has the rotation layer 15 on the reference layer 13 with the exchange bias layer 14 intervening therebetween. During writing of data into the MTJ element 1, the rotation layer 15 generates a leak magnetic field due to the rotation of its magnetization caused by a write current. Thus, in the MTJ element 1 according to the embodiment, the high-frequency magnetic field assist effect is obtained by the leak magnetic field generated from the rotation layer 15.

In addition, the dimension of the MTJ element 1 in the X-direction is greater than the dimension of the contact 50B in the X-direction in FIG. 9. On the contrary, the dimension of the contact 50B in the X-direction may be greater than the dimension of the MTJ element 1 in the X-direction.

As shown in FIG. 10, an insulating film 17X is deposited on the MTJ element 1 and the interlayer insulating film 33 by, for example, the CVD method and an atomic layer deposition (ALD) method.

The insulating film 17X preferably has a function of protecting the MTJ element 1 against oxygen and water. Therefore, for example, silicon nitride (SiN) or aluminum oxide is used for the insulating film 17X.

In the example shown in FIG. 10, the thickness tb1 of the insulating film 17X is the about same as the thickness to of the lower electrode 19A. The thickness tb1 of the insulating film 17X on the interlayer insulating film 33 is the about same as the thickness of the insulating film 17X on the side surface of the MTJ element 1. On the interlayer insulating film 33, the thickness tb1 of the insulating film 17X is a thickness in a direction perpendicular to the substrate surface. On the side surfaces of the MTJ element 1 and the electrodes 19B, the thickness of the insulating film 17X is a thickness in a direction parallel to the substrate surface.

A fourth magnetic layer 16X is deposited on the insulating film 17X by, for example, the sputtering method. For example, the magnetic layer 16X has an in-plane magnetization direction. The magnetic layer 16X is a soft-magnetic layer made of NiFe or CoFeB. The thickness of the magnetic layer 16X in a direction parallel to the substrate surface is, for example, less than or equal to the thickness of the MTJ element 1. For example, the thickness of the magnetic layer 16X is 20 nm or less.

The magnetic layer 16X is etched by an anisotropic etching method such as the RIE method. Then, as shown in FIG. 11, a sidewall magnetic layer 16 remains on the side surface of the MTJ element 1. The sidewall magnetic layer 16 cylindrically covers the side surface of the MTJ element 1. The top surface of the insulating film 17X on the upper electrode 19B and the interlayer insulating film 33 is exposed by the etching of the magnetic layer 16.

In the example shown in FIG. 11, the upper end of the sidewall magnetic layer 16 is, for example, substantially as high as the top surface of the rotation layer 15. The position of the upper end of the sidewall magnetic layer 16 can be adjusted by the time for the anisotropic etching of the magnetic layer 16X. In addition, the position of the lower end of the sidewall magnetic layer 16 is, for example, substantially equal to the height of the bottom surface of the storage layer 11. The position of the lower end of the sidewall magnetic layer 16 can be adjusted by the thickness of the insulating film 17X on the interlayer insulating film.

It is preferable that the sidewall magnetic layer 16 be not continuous between adjacent MTJ elements 1 but rather be divided to inhibit the mutual interference of the memory cells.

Figure 12:
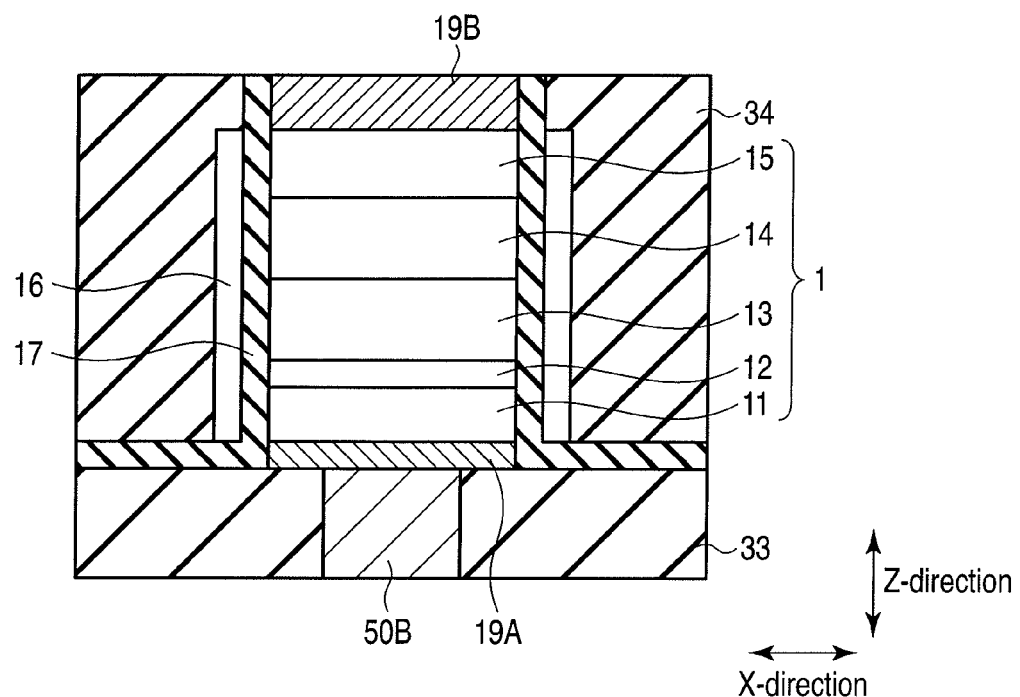
FIG. 12 is a diagram showing the method of manufacturing the magnetoresistive random access memory according to the embodiment.

As shown in FIG. 12, an interlayer insulating film 34 is deposited over the MTJ element 1. Then, the top surface of the interlayer insulating film 34 is also planarized by the CMP method or the RIE method.

Furthermore, the insulating film covering the top surface of the upper electrode 19B is removed, and the top surface of the upper electrode 19B is exposed. Thus, the sidewall magnetic layer 16 and a sidewall insulating film 17 cylindrically covering the side surface of the MTJ element are formed.

A metal film made of, for example, aluminum (Al) or copper (Cu) is deposited on the upper electrode 19B and the interlayer insulating film 34 by the sputtering method. The deposited metal film is processed by the photolithographic technique and the RIE method. Thus, as shown in FIG. 2, a bit line BL extending in the X-direction is formed. The bit line BL is connected to one end of the MTJ element 1.

In the manufacturing process shown in FIG. 8 to FIG. 12, the sidewall insulating film 17 is provided between the sidewall of the upper electrode 19B and the interlayer insulating film 34 covering the MTJ element. The sidewall insulating film 17 is also provided between the lower end of the sidewall magnetic layer 16 and the interlayer insulating film (substrate) 33 in which the contact plug 50B is embedded.

In addition, before depositing the interlayer insulating film 34, the sidewall insulating film 17 may be subjected to anisotropic etching to expose the top and side surfaces of the upper electrode 19B. Accordingly, the interlayer insulating film 34 comes into direct contact with the side surface of the upper electrode 19B.

The MRAM according to the embodiment is manufactured by the method described above.

The MTJ element 1 having the rotation layer 15 is formed by the manufacturing method shown in FIG. 2 to FIG. 12. Further, the cylindrical sidewall magnetic layer 16 is formed over the side surface of the MTJ element 1 via an insulating film.

During writing of data into the MTJ element 1, the leak magnetic field resulting from the high-speed rotation of the magnetization of the rotation layer 15 is collected by the sidewall magnetic layer 16. That is, the dispersion of the high-frequency magnetic field is inhibited, and the magnetic field generated from the rotation layer 15 is efficiently applied to the magnetization of the storage layer 11 which is making a precession movement due to the supply of the write current. Thus, the application of the high-frequency magnetic field assist effect and the formation of the MTJ element having the sidewall magnetic layer allow an increased high-frequency magnetic field assist effect on the MTJ element 1.

Consequently, the MRAM manufacturing method according to the embodiment makes it possible to provide an MRAM in which the write current for the magnetoresistive effect element is reduced.

(2) Modifications

Modifications of the magnetoresistive random access memory (MRAM) according to the embodiment are described below with FIG. 13 to FIG. 18. It is to be noted that the same components as the components in the embodiment are provided with the same signs in the modifications and are described in detail when necessary.

Figure 13:
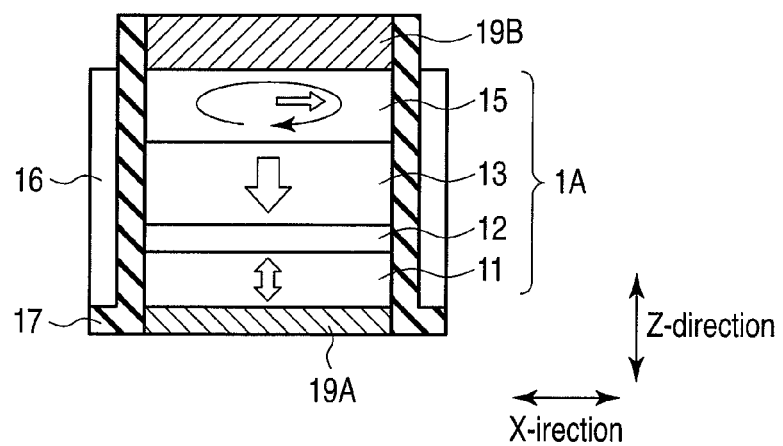
FIG. 13 is a diagram showing a modification of the magnetoresistive random access memory according to the embodiment.

FIG. 13 shows a modification of the embodiment. FIG. 13 shows the sectional structure of an MTJ element according to this modification.

In the MTJ element 1 according to the embodiment shown in FIG. 4, the antiferromagnetic layer (exchange bias layer) 14X is provided between the rotation layer 15 and the reference layer 13.

As shown in FIG. 13, if the inversion threshold of the magnetization of the reference layer 13 is much higher than the inversion threshold of the magnetization of the storage layer 11, the exchange bias layer 14 does not have to be provided. In this case, the reference layer 13 is in contact with the rotation layer 15.

According to the example shown in FIG. 13, the aspect (thickness) of an MTJ element 1A is reduced. Thus, in an MRAM that uses the MTJ element 1A shown in FIG. 13, the distance between the MTJ elements 1A adjacent in a memory cell array does not have to be great to ensure a processing margin. This can contribute to a chip size reduction or to the improvement of storage density at a given chip size.

FIG. 14 and FIG. 15 show modifications of the embodiment. FIG. 14 and FIG. 15 show the sectional structures of MTJ elements 1B, 1C according to these modifications, respectively.

As has been described with FIG. 10, the position (height) of the lower end of the sidewall magnetic layer covering the side surface of the MTJ element 1 can be adjusted by the thickness of the sidewall insulating film provided between the lower end of the sidewall magnetic layer and the substrate (interlayer insulating film).

As shown in FIG. 14, when the thickness tb2 of a sidewall insulating film 17A between the lower end of a sidewall magnetic layer 16A and a member (e.g., an interlayer insulating film) thereunder is greater than the thickness te of a lower electrode 19A, the lower end of the sidewall magnetic layer 16A is higher than the top surface of the lower electrode 19A. Therefore, the height of the lower end of the sidewall magnetic layer 16A is located between the bottom and top surfaces of the storage layer 11.

As shown in FIG. 15, when the thickness tb3 of a sidewall insulating film 17A between the lower end of a sidewall magnetic layer 16B and a member (here, an interlayer insulating film 33) thereunder is smaller than the thickness te of a lower electrode 19A, the lower end of the sidewall magnetic layer 16B is lower than the top surface of the lower electrode 19A. Therefore, the sidewall magnetic layer 16B covers the side surface of the storage layer 11 and also covers part of the side surface of the lower electrode 19A via a sidewall insulating film 17B.

FIG. 16 shows a modification of the embodiment. FIG. 16 shows the sectional structure of an MTJ element 1D according to the modification.

As described above, the position of the upper end of a sidewall magnetic layer 16C can be adjusted by the etching condition for the sidewall magnetic layer in the manufacturing step shown in FIG. 11.

Thus, as shown in FIG. 16, the upper end of the sidewall magnetic layer 16C may be level with or higher than the bottom surface of an upper electrode 19B. In the example shown in FIG. 16, the upper end of the sidewall magnetic layer 16C is higher than the top surface of a rotation layer 15. The sidewall magnetic layer 16C covers the side surface of the upper electrode 19B via an insulating film 17. The position of the upper end of the sidewall magnetic layer 16C corresponds to the position of the top surface of the upper electrode 19B.

The leak magnetic field LB of the rotation layer 15 is also generated from the end of the top surface of the rotation layer 15. The magnetic field is emitted to expand upward, and the magnetic field is therefore also distributed above the top surface of the rotation layer 15. Therefore, the sidewall magnetic layer 16C extends higher than the top surface of the rotation layer 15 and can thus efficiently collect the high-frequency magnetic field LB generated by the rotation layer 15.

In the manufacturing method described above, the upper end of the sidewall magnetic layer 16C is etched to remove the sidewall magnetic layer 16C from the top surface of the upper electrode 19B. However, in the case of the structure shown in FIG. 16, the magnetic layer on the top surface of the upper electrode 19B may be removed by the CMP method.

FIG. 17 and FIG. 18 show modifications of the embodiment, respectively. FIG. 17 shows the sectional structure of an MTJ element 1E according to the modification. FIG. 18 shows the planar structure of an MTJ element 1F according to the modification different from the modification of FIG. 17.

In the examples described above, the sidewall magnetic layer has a cylindrical structure and covers the side surface of the MTJ element. However, as shown in FIG. 17 and FIG. 18, the sidewall magnetic layer may be slit.

In the modification as shown in FIG. 17, a slit 90 is provided in a sidewall magnetic layer 16D along a direction that intersects with the stacking direction of components of the MTJ element 1E. The slit 90 is filled with, for example, an insulator (not shown). Although the slit 90 is provided at the position of a storage layer 11 in the example shown in FIG.

17, the slits 90 may be provided at the positions of other components 12, 13, 14, 15 of the MTJ element 1E.

As in the modification shown in FIG. 18, a slit 91 may be provided in a sidewall magnetic layer 16E along the stacking direction of components of the MTJ element 1F. The slit 91 may extend from the upper end to lower end of the sidewall magnetic layer 16E in the Z-direction, or may extend from the upper end to central portion of the sidewall magnetic layer 16E so that the lower side portion of the sidewall magnetic layer 16E may not be divided by the slit.

In FIG. 17 and FIG. 18, not only the sidewall magnetic layers 16D, 16E but also a sidewall insulating film 17 may be slit.

In the examples described above, the sidewall insulating film between the sidewall magnetic layer and the MTJ element may be removed, and an air gap may be provided between the sidewall magnetic layer and the MTJ element.

The components of the MTJ element 1 in the example shown in FIG. 4 are stacked on the lower electrode 19A in the following order from the substrate side: the storage layer, the intermediate layer (nonmagnetic layer), the reference layer, the exchange bias layer and the rotation layer. Alternatively, the components may be stacked on the lower electrode in reverse order from the substrate side: the rotation layer, the exchange bias layer, the reference layer, the intermediate layer and the storage layer.

Furthermore, in the MRAM according to the embodiment described above, the MTJ element 1 in which the reference layer 13 and the storage layer 11 are perpendicular magnetization films has been shown by way of example. However, the MRAM can also use an MTJ element in which a reference layer and a storage layer are in-plane magnetization films. In this case, advantages substantially similar to the advantages brought about by the MTJ element shown in FIG. 3 and FIG. 4 can also be provided if the MTJ element has a rotation layer to obtain the high-frequency magnetic field assist effect and if a sidewall magnetic film in which the leak magnetic field generated from the rotation layer concentrates is provided on the side surface of the MTJ element.

In the modifications of the MRAM according to the embodiment shown in FIG. 13 to FIG. 18, the write current for the magnetoresistive effect element can be reduced as in the MRAM shown in FIG. 4.

[Addition]

The magnetic memory (MRAM) according to the embodiment allows a reduced write current for the magnetoresistive effect element.

As a result, the MRAM according to the embodiment allows reduced power consumption required for its driving. Moreover, in the MRAM according to the embodiment, the select transistor does not have to be increased in size to supply a high write current to the magnetoresistive effect element. Thus, the MRAM according to the embodiment enables a smaller select transistor and can contribute to a chip size reduction and the improvement of storage density.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory comprising:

a magnetoresistive effect element having a first magnetic layer of which the magnetization direction perpendicular to a film plane is variable, a second magnetic layer of which the magnetization direction perpendicular to a film plane is fixed, a third magnetic layer of which the magnetization direction parallel to a film plane is variable, and an intermediate layer between the first magnetic layer and the second magnetic layer, the third magnetic layer generating a magnetic field by a rotation of the magnetization of the third magnetic layer due to a first current flowing in the first, second, and third magnetic layers, a magnitude of the first current being equal to or larger than an inversion threshold of the magnetization direction of the first magnetic layer; and a fourth magnetic layer which is provided on the side surface of the magnetoresistive effect element via an insulating film and which collects the magnetic field generated from the third magnetic layer, the collected magnetic field applied to the first magnetic layer, and the fourth magnetic layer isolated from the third magnetic layer by the insulating film provided between the third magnetic layer and the fourth magnetic layer.

2. The magnetic memory according to claim 1, wherein the fourth magnetic layer cylindrically covers the magnetoresistive effect element.

3. The magnetic memory according to claim 1, wherein the magnetoresistive effect element includes an antiferromagnetic layer which is provided between the second magnetic layer and the third magnetic layer, and which fixes the magnetization of the second magnetic layer.

4. The magnetic memory according to claim 1, wherein one end of the fourth magnetic layer in the stacking direction of the first, second and third magnetic layers is located between the top and bottom surfaces of the first magnetic layer.

5. The magnetic memory according to claim 1, wherein one end of the fourth magnetic layer in the stacking direction of the first, second and third magnetic layers is located between the top and bottom surfaces of the third magnetic layer.

6. The magnetic memory according to claim 1, wherein the height of one end of the fourth magnetic layer in the stacking direction of the first, second and third magnetic layers corresponds to the height of one end of the magnetoresistive effect element.

7. The magnetic memory according to claim 1, further comprising:

a first electrode provided between a substrate and the bottom of the magnetoresistive effect element; and a second electrode provided on the top of the magnetoresistive effect element.

8. The magnetic memory according to claim 7, wherein the lower end of the fourth magnetic layer is located lower than the top surface of the first electrode.

9. The magnetic memory according to claim 8, wherein the thickness of the insulating film between the lower end of the fourth magnetic layer and the substrate is smaller than the thickness of the first electrode.

10. The magnetic memory according to claim 7, wherein the lower end of the fourth magnetic layer is located higher than the top surface of the first electrode.

11. The magnetic memory according to claim 10, wherein the thickness of the insulating film between the lower end of the fourth magnetic layer and the substrate is greater than the thickness of the first electrode.

12. The magnetic memory according to claim 7, wherein the upper end of the fourth magnetic layer is located higher than the bottom surface of the second electrode.

13. The magnetic memory according to claim 7, wherein the upper end of the fourth magnetic layer is located lower than or equal to the bottom surface of the second electrode.

14. The magnetic memory according to claim 7, further comprising:
an interlayer insulating film covering the magnetoresistive effect element and the fourth magnetic layer,
wherein the insulating film is provided between the second electrode and the interlayer insulating film.

15. The magnetic memory according to claim 1, wherein the fourth magnetic layer includes a slit.

16. The magnetic memory according to claim 1, wherein a material for the fourth magnetic layer is NiFe or CoFeB.

17. The magnetic memory according to claim 1, wherein a material for the third magnetic layer is NiFe or CoFeB.

18. The magnetic memory according to claim 1, wherein the third magnetic layer includes no magnetic anisotropy.

19. The magnetic memory according to claim 1, wherein the planar shape of the third magnetic layer is circular.

20. The magnetic memory according to claim 1, wherein a material for the insulating film is aluminum oxide or silicon nitride.

* * * * *